United States Patent [19]

Shioya et al.

[11] Patent Number: 4,487,787
[45] Date of Patent: Dec. 11, 1984

[54] METHOD OF GROWING SILICATE GLASS LAYERS EMPLOYING CHEMICAL VAPOR DEPOSITION PROCESS

[75] Inventors: Yoshimi Shioya, Yokohama; Mikio Takagi, Kawasaki, both of Japan

[73] Assignee: Fujitsu Limited, Japan

[21] Appl. No.: 436,294

[22] Filed: Oct. 25, 1982

Related U.S. Application Data

[63] Continuation of Ser. No. 215,629, Dec. 12, 1980, abandoned.

[30] Foreign Application Priority Data

Dec. 28, 1979 [JP] Japan .................. 54-171068

[51] Int. Cl.³ .......................................... H01L 21/316
[52] U.S. Cl. .......................................... 427/8; 427/85; 427/53; 427/55
[58] Field of Search ................. 427/93, 95, 85, 8

[56] References Cited

U.S. PATENT DOCUMENTS 3,481,781  12/1969  Kern ........................ 427/95
4,072,767   2/1978  Suda et al. ................ 427/8
4,098,923   7/1978  Alberti et al. ............. 427/93
4,100,310   7/1978  Ura et al. .................. 427/95

Primary Examiner—John D. Smith
Attorney, Agent, or Firm—Staas & Halsey

[57] ABSTRACT

Impurity concentration doped in PSG deposited on semiconductor substrates employing chemical vapor deposition process depends on the flow rate of reactive gases in the neighborhood of the first one of the plural semiconductor substrates processed with the same equipment in one batch at the same time. Regulation of the flow rate of the reactive gases in the neighborhood of the first one of the plural semiconductor substrates processed with the same equipment in one batch at the same time is effective to make the impurity concentration doped in PSG uniform for all the semiconductor substrates processed in one batch employing the presently available sealed tube type equipment for vacuum vapor deposition process. The flow rate regulation is possible by monitoring readings of a manometer which is arranged around the inlets thereof and which was calibrated by the flow rate of a nonreactive gas such as nitrogen gas.

8 Claims, 3 Drawing Figures

METHOD OF GROWING SILICATE GLASS LAYERS EMPLOYING CHEMICAL VAPOR DEPOSITION PROCESS

This is a continuation, of application Ser. No. 215,629 filed Dec. 12, 1980, now abandoned.

BACKGROUND OF THE INVENTION

This invention relates to a method of growing silicate glass layers, such as phospho-silicate glass layers (hereinafter referred to as PSG layers), on semiconductor substrates employing a chemical vapour deposition process. More particularly, this invention relates to an improvement of the method to enable the impurity concentration doped in the silicate glass to be made uniform for each of the semiconductor substrates processed in one batch at the same time.

It is widely known that a sealed tube made of quartz or stainless steel is usually employed for growing silicate glass layers, such as PSG layers, on semiconductor substrates employing the chemical vapour deposition process. The sealed tube is provided with an electric heater which surrounds the sealed tube to heat the semiconductor substrates placed therein, one inlet at one end of the sealed tube, a second inlet at the same one end of the sealed tube or along the semiconductor substrates placed therein, one outlet at the other end of the sealed tube, and a vacuum pump which causes reactive gases to flow inside the sealed tube at a specific low pressure. When the chemical vapour deposition process is put into operation, the vacuum pump is operated to cause the reactive gases containing silane ($SiH_4$), phosphine ($PH_3$) and oxygen ($O_2$) to flow into the sealed tube through the inlets and to flow out of the sealed tube through the outlet. The length of such a sealed tube is usually selected to be 2 meters and the intermediary portion, with a length of approximately 1 meter, of the sealed tube is usually kept at a uniform temperature by the heater. A plurality of semiconductor wafers are arranged on a wafer holder or boat placed in the uniform temperature zone of the sealed tube in the vertical or inclined position and in the transverse direction with respect to the sealed tube. The reactive gases containing silane ($SiH_4$), phosphine ($PH_3$) and oxygen ($O_2$) flowing inside the sealed tube make chemical reaction in the neighborhood of the semiconductor wafers to deposit PSG layers on each of the semiconductor wafers.

When growing PSG layers on each of the semiconductor wafers standing side by side in such a long sealed tube reactor, it is fairly difficult to make the conditions of chemical vapour deposition process uniform at each location along the long tube. This of course causes an adverse effect for the uniform impurity concentration doped in PSG grown by the process. It is extremely important to make the impurity or phosphorus concentration doped in the PSG uniform for each of the wafers processed in one batch.

In reality, however, no effective methods were available in the prior art for making the impurity or phosphorus concentration doped in PSG uniform for each of the semiconductor wafers aligned along the flow of the reactive gasses but in the transverse direction to the flow of the reactive gases. Therefore, a practical but inefficient method was employed to make the impurity or phosphorus concentration doped in PSG uniform for all the wafers processed in one batch at the same time. Namely, conditions optimum for making the impurity or phosphorus concentration uniform for all the wafers were determined, on a trial and error basis, by repetition of trials made with varied parameters, such as the temperature, the quantity of gas supplied for the reaction, the internal pressure of the sealed tube, the quantity of substrates processed in one batch, and the shape and length of the sealed tube. It is clear that this trial-and-error-type method is inevitably involved with inefficiency, incorrectness, longer time consumption and inconvenience.

SUMMARY OF THE INVENTION

An object of this invention is to provide a method of growing silicate glass layers, particularly PSG layers, on semiconductor wafers based on a chemical vapour deposition process employing a sealed tube made of quartz or stainless steel which is provided with a heater surrounding the sealed tube, inlets and an outlet for reactive gases, and a vacuum pump which causes the reactive gases to flow inside the sealed tube to make chemical reaction in the neighborhood of the semiconductor wafers aligned side by side in the uniform temperature zone in the sealed tube. The improvement is to enable the impurity or phosphorus concentration doped in PSG to be made uniform for all the semiconductor wafers processed in one batch at the same time.

We have discovered that the flow rate of the reactive gases flowing inside the sealed tube is most sensitive, out of the various parameters, to the impurity or phosphorus concentration doped in PSG. It is effective for making the impurity or phosphorus concentration doped in PSG uniform for all the semiconductor wafers processed in the same sealed tube at the same time, to maintain the flow rate of the reactive gases at the rate which is effective to cause the uniform quantity of the reactive gases to contact with each semiconductor wafer.

After a number of experiments carried out to prove the concept mentioned above, we have determined that a specific specification of an equipment employed for the process and a specific process condition readily determine an optimum flow rate of the reactive gases for making the impurity or phosphorus concentration doped in PSG uniform for all the semiconductor wafers processed at the same time. Moreover, it is readily possible to maintain the flow rate of the reactive gases in the neighborhood of the wafers at the optimum flow rate by regulating the gas pressure by monitoring the readings of a manometer which is arranged in the neighborhood of the inlet of the reactive gases and is calibrated to represent the flow rate of nitrogen ($N_2$) gas. We have further determined that the optimum flow rate of the reactive gases can be selected from the manometer reading range which represents the nitrogen ($N_2$) gas flow rate range of 6 through 12 m/sec. calibrated as mentioned above, according to the geometrical and/or processwise conditions of a specific equipment and a process employed.

It is also noted that there may be different arrangements of inlets. All of the inlets, for example, may be provided at one end of the sealed tube. However, in order to supply some of the reactive gases, for example oxygen ($O_2$), uniformly to all the semiconductor wafers, the inlet for such gases, for example oxygen ($O_2$), may be scattered along the semiconductor wafers. This latter inlet arrangement is readily realized by placing one or more long inlet tubes which has or have a number of holes thereon along the semiconductor wafers and which is or are placed along the semiconductor wafers. Such gases, for example oxygen ($O_2$), flow into the sealed tube through the number of holes provided on the long tube or tubes.

BRIEF DESCRIPTION OF THE DRAWINGS

The invention, together with its various features and advantages, can be readily understood from the following more detailed description presented in conjunction with the following drawings, in which.

DETAILED DESCRIPTION OF THE PREFERRED EMBODIMENTS

Figure 1:
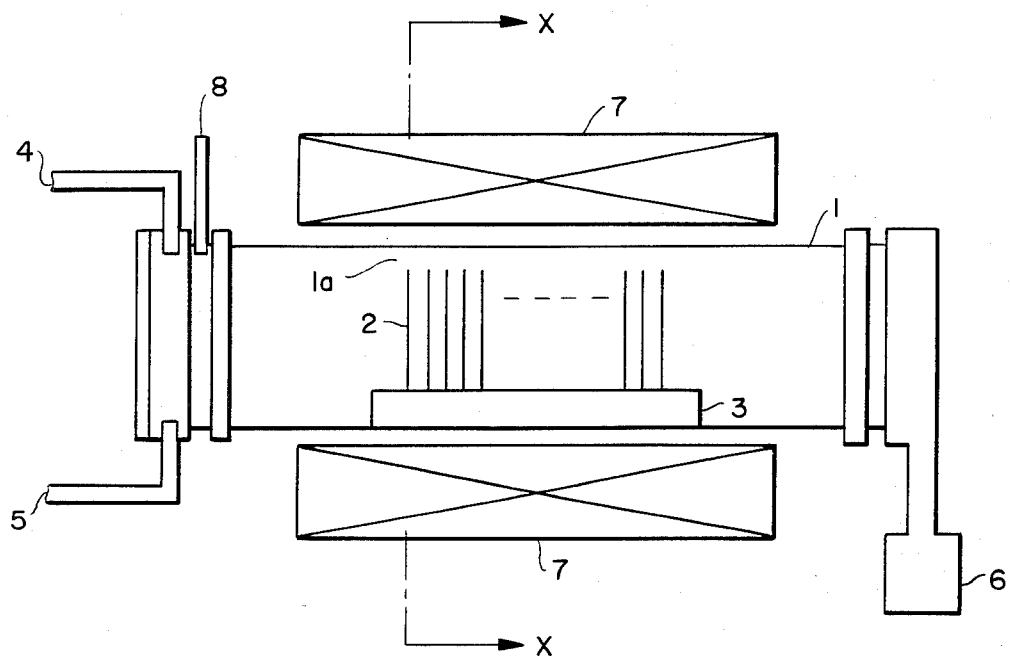
FIG. 1 shows a schematic longitudinal cross-sectional view of an equipment for chemical vapour deposition.
Figure 2:
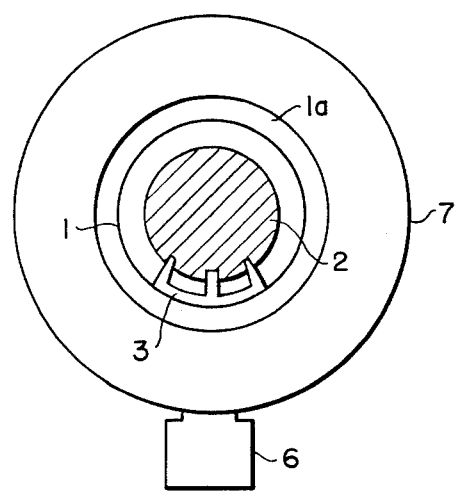
FIG. 2 shows a transverse cross-sectional view of the equipment for chemical vapour deposition, taken along section lines x—x in FIG. 1.

With reference to FIGS. 1 and 2, an equipment for the chemical vapour deposition process employed for growing silicate glass layers, such as PSG layers, comprises a sealed tube 1 made of quartz or stainless steel in which a plurality of semiconductor wafers 2 are arranged on a wafer holder or a boat 3 placed inside the sealed tube 1. The arrangement of semiconductor wafers 2 is made in the vertical or inclined position and in the transverse direction with respect to the sealed tube 1, usually with uniform intervals along the sealed tube 1 within the uniform temperature zone heated by an electric heater 7 surrounding the sealed tube 1. The reactive gases containing silane ($SiH_4$), phosphine ($PH_3$) flow into the sealed tube 1 through an inlet 4, and oxygen ($O_2$) flows into the sealed tube 1 through an inlet 5. As mentioned above, the one or more inlets for oxygen ($O_2$) can be arranged at intervals in one or more long tubes placed inside the sealed tube 1 and along the array of the wafers 2. A vacuum pump 6 is employed to cause the gases to flow inside the sealed tube 1. A manometer 8 is arranged to monitor the internal pressure of the sealed tube 1.

When those gases are supplied in the neighborhood of semiconductor wafers 2 heated at the temperature of approximately 450° C., the following reactions occur to deosit PSG, which is a mixture of silicon dioxide ($SiO_2$) and phosphorus pentaoxide ($P_2O_5$), on the semiconductor wafers 2:

$$SiH_4 + O_2 = SiO_2 + 2H_2$$

$$4PH_3 + 7O_2 = 2P_2O_5 + 4H_2O + 2H_2$$

We assumed that a supply of a uniform quantity of the reactive gases to each wafer 2 would be essential for making the impurity or phosphorus concentration doped in PSG uniform for all the semiconductor wafers 2 processed in the same sealed tube 1 at the same time. Further, we assumed that regulation of the flow rate of the reactive gases in the neighborhood of the semiconductor wafers 2 could be effective to supply the uniform quantity of the reactive gases to all the semiconductor wafers 2.

In order to prove the concepts which we assumed would be effective for making the impurity or phosphorus concentration doped in PSG uniform for all the semiconductor wafers 2, we carried out two different groups of experiments employing two different sealed tubes.

For the first group of experiments, we employed a quartz sealed tube 1 with a diameter of 103 mm in which 30 sheets of semiconductor wafers 2 with a diameter of 3 inches were aligned side by side with approximately 3-cm uniform intervals on the boat 3 placed in the intermediary portion of the sealed tube 1 at which the internal temperature was kept at approximately 450° C. by the heater 7. This is shown in FIGS. 1 and 2.

For the second group of experiments, we employed a quartz sealed tube 1 with a diameter of 123 mm in which 110 sheets of semiconductor wafers 2 with a diameter of 4 inches were so aligned that a couple of wafers were arranged back to back with 3 mm spacing and each couple was arranged with 1.5 cm uniform intervals on the boat 3 placed in the uniform temperature zone at which the internal temperature was kept at 425° C.

For the purpose of acquiring a reference for regulation of the flow rate of the reactive gases at an area $1a$ which is close to the first one of the aligned semiconductor wafers 2, nitrogen gas ($N_2$) was injected into the sealed tube 1 through the inlet 4 at various flow rates which were regulated by means of the vacuum pump 6, before the manometer 8 was read. This procedure was carried out to calibrate the reading of the manometer 8 corresponding to a specific flow rate of the nitrogen gas at the area $1a$ inside the sealed tube 1. More specifically, the readings of the manometer 8 were detected corresponding to the various flow rates of nitrogen ($N_2$) gas by reading a mass flow meter arranged on the inlet 4, in order to utilize the readings of the manometer 8 and to assume the flow rate of the reactive gases thereafter. The physical principles of this procedure will be discussed below. With v referring to the flow rate of a nonreactive gas such as nitrogen, S to the cross-sectional area through which the gase flows, and V to the volume of the gas flowing during the unit time, the following formula is affirmed.

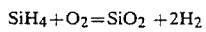

$$v = V/S \qquad (1)$$

When this formula (1) is applied to the equipment shown in FIGS. 1 and 2, the cross-sectional area, S, corresponds to the area which is the internal cross-sectional area of the sealed tube 1 less the cross-sectional area of a semiconductor wafer 2 (disregarding the cross-sectional area of the boat 3). On the other hand, the volume of the gas flow during the unit time, V, can be shown as:

$$PV/T = P_o V_o / T_o \qquad (2)$$

wherein,

P is the internal pressure of the sealed tube 1,

T is the internal temperature of the sealed tube 1,

Po is the pressure of the gas prior to flowing into the sealed tube 1,

To is the temperature of the gas prior to flowing into the sealed tube 1, and

Vo is the volume of the gas flowing during the unit time prior to flowing into the sealed tube 1.

Therefore, combining these formulae (1) and (2), the flow rate of the gas, v, is shown as:

$$v = P_o V_o T / PST_o \qquad (3)$$

Accordingly, an arbitrary flow rate can be realized for any non reactive gas by adjusting the right side of the formula (3). Therefore, adjustment of the internal pressure of the sealed tube 1 by means of the vacuum pump 6 can readily achieve the flow rate for any non-reactive gas. The reason why the area 1a was used between the circular edge of the first one of the aligned semiconductor wafers 2 and the internal space of the sealed tube 1 is that we considered the above-mentioned chemical reactions to have scarcely occurred, before the reactive gases reach this area 1a. As a result, the flow rates of the reactive gases and the non-reactive nitrogen ($N_2$) gas are close with each other in this area 1a.

The above reading of the manometer 8 was employed for both groups of experiments to determine the flow rate of the reactive gases at the area 1a which is close to the first one of the aligned semiconductor wafers 2.

Thereafter, for the first group of experiments, the reactive gases containing silane ($SiH_4$), phosphine ($PH_3$) and oxygen ($O_2$) where supplied at various flow rates to grow PSG layers with an approximate thickness of 10,000–15,000 angstroms on the semiconductor wafers 2. Since it is well-known that the relative composition of the reactive gases should be selected in accordance with the required specification of PSG, the experiments were carried out for a variety of compositions of the reactive gases, albeit the major interest was the case in which the volumetric ratio of phosphine ($PH_3$) and silane ($SiH_4$) was 1:10. For purposes of comparison, two types of heat treatment processes were applied to each case in which the flow rate was varied. The first was to keep the wafers 2 at 1,000° C. for 20 minutes and the second was to keep the wafers 2 at 1,100° C. for 20 minutes.

Figure 3:
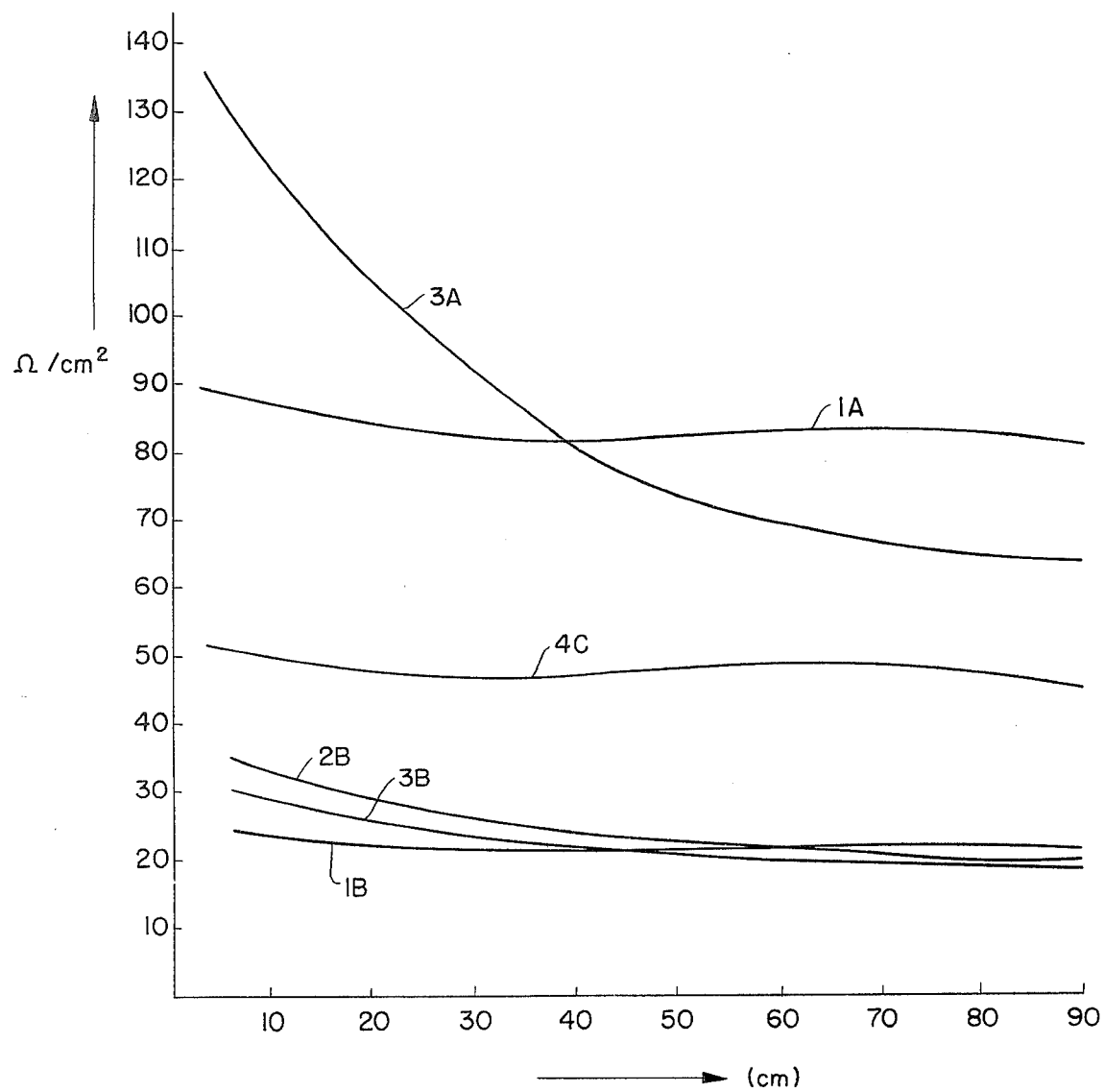
FIG. 3 is a graph of sheet resistance representing phosphorus concentration versus wafer position in a sealed tube.

The wafers of the experiments are illustrated in the graph shown in FIG. 3, wherein the Y axis represents the sheet resistance ($r/cm^2$) of each PSG layer which is believed to be an index representing the phosphorus concentration doped in the PSG layer and the X axis represents the corresponding wafer position (cm) in the sealed tube 1.

Firstly, Curve 1A shows the case in which the flow rate of the reactive gases, which was assumed in the manner mentioned above was 12 m/sec. (1.34 Torr as the reading of the manometer 8) and the applied heat treatment was the first type. Secondly, Curve 3A shows the case in which the flow rate of the reactive gases, which was assumed in the manner mentioned above, was 22 m/sec. (0.72 Torr as the reading of the manometer 8) and the applied heat treatment applied was the first type. The former shows a better uniformity in the phosphorus concentration doped in PSG for each wafer 2 independently of the location of the wafer 2.

Thirdly, Curves 1B, 2B and 3B respectively show the cases in which the flow rates of the reactive gases, which were assumed in the manner mentioned above, were respectively 12 m/sec. (1.34 Torr as the reading of the manometer 8), 17 m/sec. (0.94 Torr as the reading of the manometer 8) and 22 m/sec. (0.72 Torr as the reading of the manometer 8) and the applied heat treatment was the second type. Albeit the variations are not as great in these cases, the same phenomenon is observed also for these cases as for the former cases. In other words, the best uniformity in phosphorous concentration doped in PSG for each wafer is observed for the reactive gases flow rate of 12 m/sec.

As described above, the results of the first group of experiments clearly show that the uniformity in phosphorus concentration doped in PSG for each of the semiconductor wafers 2 processed in one batch at the same time depends on the flow rate of the reactive gases and that the reactive gas flow rate of 12 m/sec. shows the optimum conditions for the above mentioned dimensional and chemical conditions.

A procedure similar to the above was taken and a similar phenomenon to the above was observed also for the second group of experiments. Out of the numerous tests, one optimum result is illustrated as Curve 4C in FIG. 3. In this case, the flow rate of the reactive gases, which was assumed in the manner mentioned above, and the heat treatment condition were 8 m/sec. (1.9 Torr as the reading of the manometer 8) and 60 sec. at 1,150° C., respectively.

Accordingly, we have determined that regulation of the flow rate range of the reactive gases by the nitrogen flow rate assumed through readings of the manometer arranged in the neighborhood of the inlets and calibrated by the flow rate of nitrogen ($N_2$) gas mentioned above, to 6 through 12 m/sec. is effective to enable the impurity or phosphorus concentration doped in PSG to be made uniform for all the semiconductor wafers processed in one batch at the same time, insofar as the presently available equipment for chemical vapour deposition with the above mentioned dimensional limitations and the above mentioned processwise conditions are concerned.

As discussed earlier, it is clear that adjustment of the manometer's reading to 1.34 Torr is effective to make the impurity or phosphorus concentration uniform for each of the semiconductor wafers processed in one batch, insofar as the vacuum vapour depositions equipment employed for the first group of experiments is concerned, regardless of the other parameters influencial to the uniformity of the impurity or phosphorus concentration.

The above-mentioned dimensional limitations applied to the equipment for the vacuum vapour deposition process and the physical and chemical limitations applied to the process should not be construed as limitations to determine the scope of this invention. In other words, a specific specification of an equipment employed for the purpose and a specific processwise condition readily determine an optimum flow rate of the reactive gases for making the impurity or phosphorus concentration doped in silicate glass uniform for all the semiconductor wafers processed at the same time.

In conclusion, in accordance with this invention, an efficient, correct, less time consuming and convenient method of growing silicate glass layers, particularly PSG layers, on semiconductor wafers employing chemical vapour deposition process is provided. The improved method enables the impurity of phosphorus concentration doped in PSG to be made uniform for all the semiconductor wafers processed in one batch at the same time.

We claim:

1. A method of chemical vapor deposition for growing phosphosilicate glass layers on a plurality of semiconductor wafers employing a sealed tube, inlets and an outlet arranged on said sealed tube for allowing reactive gases to flow in and out of said sealed tube, a manometer on said tube for monitoring the internal pressure of said sealed tube and a vacuum pump to cause said reactive gases to flow longitudinally through said sealed tube past the plurality of semiconductor wafers to allow said reactive gases to make chemical reaction with said plurality of semiconductor wafers aligned in a position selected from the vertical and inclined positions at a predetermined interval and in the transverse direction with respect to the longitudinal flow of said reactive gases through said sealed tube, the method comprising the step of regulating the longitudinal flow rate of said reactive gases through the sealed tube adjacent said semiconductor wafers, wherein the flow rate in terms of gas velocity of said reactive gases in the longitudinal direction through said sealed tube is 6 to 12 m/sec. at a position close to the first one of said plurality of semiconductor wafers and is regulated by employing said manometer which is arranged at said inlets of said sealed tube and which is calibrated by the longitudinal flow rate in terms of gas velocity of nonreactive gas through said sealed tube.

2. A method of chemical vapor deposition for growing silicate glass layers on a plurality of semiconductor wafers comprising the steps of:
 (a) providing a plurality of semiconductor wafers in a sealed tube, said wafers aligned in a position selected from the vertical and inclined positions at a predetermined interval and in a transverse direction with respect to the longitudinal direction of said sealed tube;
 (b) flowing nonreactive gas in and out of said sealed tube through inlets and an outlet arranged on the sealed tube and using a vacuum pump to cause the nonreactive gas to flow longitudinally through the sealed tube for calibrating flow rates using a manometer;
 (c) flowing reactive gases in and out of the sealed tube through the inlets and outlet arranged on the sealed tube and using a vacuum pump to cause the reactive gases to flow longitudinally through the sealed tube past a plurality of semiconductor wafers to allow the reactive gases to make chemical reaction with the plurality of semiconductor wafers under the flow rates calibrated in step (b);
 (d) defining the optimum range of the gas velocity in the longitudinal direction of the sealed tube adjacent the semiconductor wafers capable of obtaining uniformly doped deposition of silicate glass to be formed on said plurality of semiconductor wafers; and
 (e) flowing reactive gases longitudinally through the sealed tube past additional pluralities of semiconductor wafers to allow the reactive gases to make chemical reaction with the additional pluralities of semiconductor wafers under a gas velocity of said optimum range, thereby uniformly growing said silicate glass layers.

3. The method of claim 2, wherein the silicate glass layer is a phospho-silicate glass layer (PSG).

4. The method of claim 2, wherein at least one of the outlets arranged on the sealed tube for providing reactive gases is positioned along the plurality of semiconductor wafers.

5. The method of claim 4, wherein the reactive gas flowing through at least said one of said inlets along said plurality of semiconductor wafers is oxygen ($O_2$).

6. The method of claim 2 or 3, wherein in step (e) the flow rate in terms of the gas velocity of the reactive gases is in the range of approximately 6 to 12 m/sec. in the longitudinal direction of said sealed tube at a position close to the first one of the plurality of semiconductor wafers and is regulated by employing said manometer arranged at said inlets and which was calibrated by the longitudinal flow rate in terms of the gas velocity of nonreactive gas in the sealed tube.

7. The method of claim 6, wherein the internal pressure of the sealed tube is adjusted by said vacuum pump to achieve the specified flow rate in terms of the gas velocity of said reactive gases in the longitudinal direction of said sealed tube adjacent the semiconductor wafers.

8. The method of claim 6, wherein an internal uniform heated temperature zone is maintained in said tube.

* * * * *

UNITED STATES PATENT AND TRADEMARK OFFICE
CERTIFICATE OF CORRECTION

PATENT NO. : 4,487,787

DATED : December 11, 1984

INVENTOR(S) : Shioya et al.

It is certified that error appears in the above-identified patent and that said Letters Patent is hereby corrected as shown below:

Column 5, line 35, "wafers" should be --results--.

Signed and Sealed this

Ninth Day of July 1985

[SEAL]

Attest:

DONALD J. QUIGG

Attesting Officer

Acting Commissioner of Patents and Trademarks